(12) United States Patent
Onohara

(10) Patent No.: US 12,177,978 B2
(45) Date of Patent: Dec. 24, 2024

(54) CIRCUIT BOARD

(71) Applicant: TOPPAN PRINTING CO., LTD., Tokyo (JP)

(72) Inventor: Jun Onohara, Tokyo (JP)

(73) Assignee: TOPPAN PRINTING CO., LTD., Tokyo (JP)

(*) Notice: Subject to any disclaimer, the term of this patent is extended or adjusted under 35 U.S.C. 154(b) by 657 days.

(21) Appl. No.: 17/338,524

(22) Filed: Jun. 3, 2021

(65) Prior Publication Data

US 2021/0298172 A1  Sep. 23, 2021

Related U.S. Application Data

(63) Continuation of application No. PCT/JP2019/046015, filed on Nov. 25, 2019.

(30) Foreign Application Priority Data

Dec. 4, 2018 (JP) ................. 2018-227135

(51) Int. Cl.
*H01F 27/28* (2006.01)
*H01F 27/36* (2006.01)
(Continued)

(52) U.S. Cl.
CPC ........... *H05K 1/165* (2013.01); *H01F 27/363* (2020.08); *H05K 1/0218* (2013.01); *H05K 1/162* (2013.01);
(Continued)

(58) Field of Classification Search
CPC ...... H05K 1/165; H05K 1/0218; H05K 1/162; H05K 3/002; H05K 3/0029; H05K 3/108;
(Continued)

(56) References Cited

U.S. PATENT DOCUMENTS 5,461,353 A     10/1995  Eberhardt
6,531,945 B1 *   3/2003  Ahn .................... H01F 17/0033
                                                   336/200
(Continued)

FOREIGN PATENT DOCUMENTS

JP    2005-268447 A    9/2005
JP    2018-160607 A   10/2018
JP    2018-195766 A   12/2018

OTHER PUBLICATIONS

International Searching Authority, "International Search Report," issued in connection with International Patent Application No. PCT/JP2019/046015, dated Dec. 24, 2019.
(Continued)

*Primary Examiner* — Shawki S Ismail
*Assistant Examiner* — Kazi S Hossain
(74) *Attorney, Agent, or Firm* — Foley & Lardner LLP

(57) ABSTRACT

A circuit board includes a glass substrate having a first surface and a second surface facing away from the first surface; a first coil wiring pattern formed on the first surface and a second coil wiring pattern formed on the second surface, the first and second coil wiring patterns constituting part of a coil; a through hole extending through a predetermined portion of the glass substrate from an end of the first coil wiring pattern to an end of the second coil wiring pattern; a through hole inner conductive surface formed on the inner side of the through hole, the first and second coil wiring patterns and the through hole inner conductive surface constituting the coil wound around a direction perpendicular to an axis of the through hole and to a direction in which the first and second coil wiring patterns extend.

6 Claims, 11 Drawing Sheets

(51) Int. Cl.
  *H05K 1/02* (2006.01)
  *H05K 1/16* (2006.01)
  *H05K 3/00* (2006.01)
  *H05K 3/10* (2006.01)
  *H05K 3/46* (2006.01)
  *H01F 17/00* (2006.01)
  *H05K 3/02* (2006.01)

(52) U.S. Cl.
  CPC ............ *H05K 3/002* (2013.01); *H05K 3/0029* (2013.01); *H05K 3/108* (2013.01); *H05K 3/4673* (2013.01); *H01F 17/0006* (2013.01); *H01F 2017/0073* (2013.01); *H05K 3/02* (2013.01); *H05K 2201/0715* (2013.01); *H05K 2201/0723* (2013.01); *H05K 2203/072* (2013.01); *H05K 2203/0723* (2013.01)

(58) Field of Classification Search
  CPC .................. H05K 3/4673; H05K 3/02; H05K 2201/0715; H05K 2201/0723; H05K 2203/072; H05K 2203/0723; H05K 3/4605; H05K 3/284; H05K 2201/0175; H01F 27/363; H01F 2017/0026; H01F 17/0013; H01G 2/06; H01G 4/228; H01G 4/38; H01G 2/22; H01G 4/33; H01G 4/30; H01L 23/15; H03H 3/00; H03H 7/0115

USPC ............................................. 336/84, 83, 200
  See application file for complete search history.

(56) References Cited

U.S. PATENT DOCUMENTS

| | | | |
|---|---|---|---|
| 2006/0290457 A1* | 12/2006 | Lee ..................... | H01F 17/0006 336/200 |
| 2007/0180684 A1* | 8/2007 | Wada ................... | H01F 41/046 336/200 |
| 2017/0094794 A1* | 3/2017 | Flemming .............. | H05K 3/107 |
| 2017/0178018 A1* | 6/2017 | Teaciuc ................ | H05K 1/0233 |

OTHER PUBLICATIONS

International Searching Authority, "Written Opinion," issued in connection with International Patent Application No. PCT/JP2019/046015, dated Dec. 24, 2019.

European Extended Search Report, dated Jan. 11, 2022, issued in corresponding European Patent Application No. 19891733.8, (10 pages).

* cited by examiner

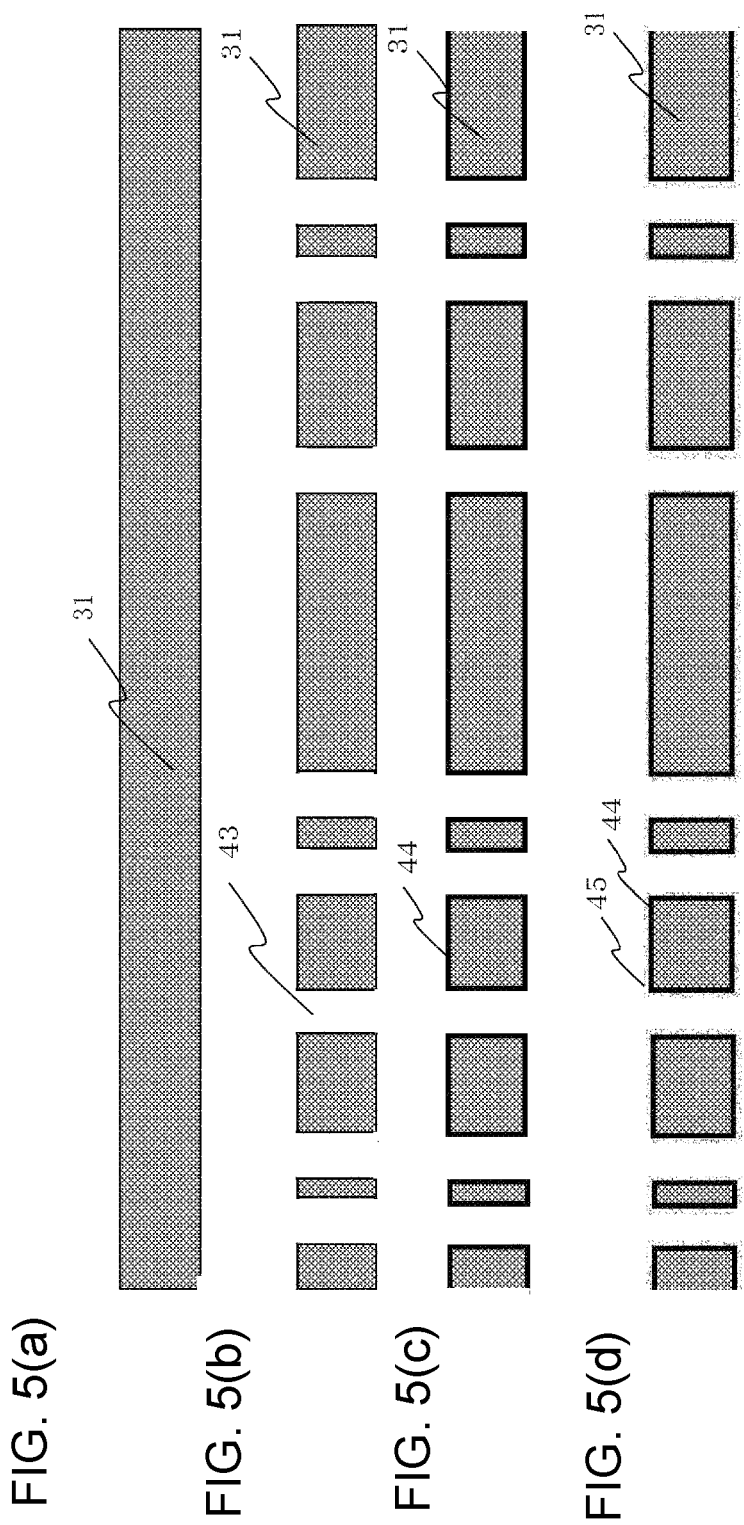

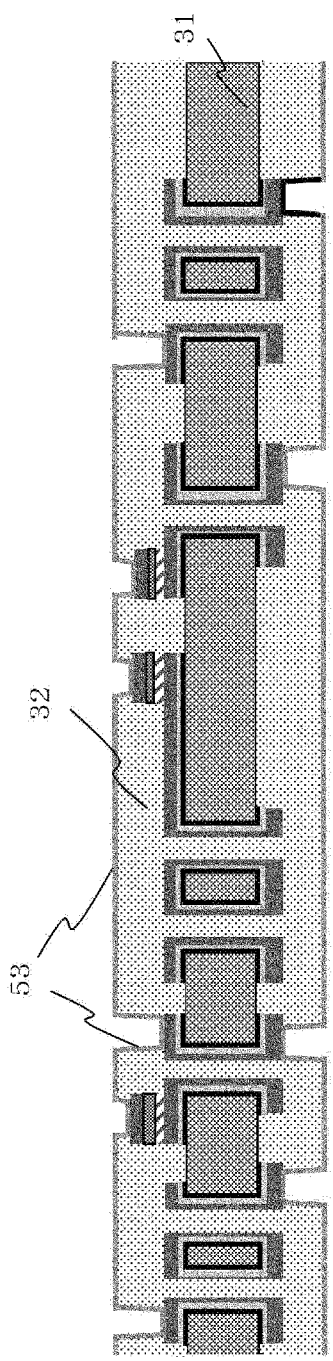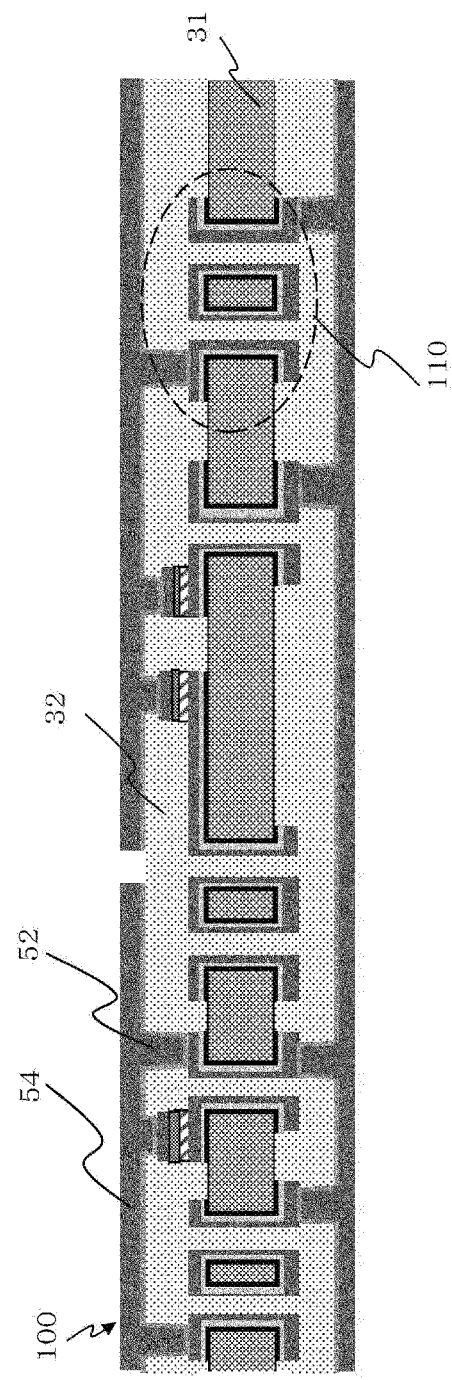
FIG. 10(q)
FIG. 10(r)

CIRCUIT BOARD

CROSS-REFERENCE TO RELATED PATENT APPLICATIONS

This application is a continuation application filed under 35 U.S.C. § 111 (a) claiming the benefit under 35 U.S.C. §§ 120 and 365 (c) of International Patent Application No. PCT/JP2019/046015, filed on Nov. 25, 2019, which is based upon and claims the benefit of priority to Japanese Patent Application No. 2018-227135, filed on Dec. 4, 2018, the disclosures of which are incorporated herein by reference in their entireties.

BACKGROUND

Technical Field

The present invention relates to circuit boards.

As the demand for mobile phones, faster wireless communications, and larger communication capacity grows, passive components of filters and the like are required to have a compact configuration on a substrate.

LC filters, known as frequency filters, consist of a combination of an element constituting a coil (i.e., inductor; represented by the letter L) and an element constituting a capacitor (represented by the letter C). For their advantages in terms of characteristics, the use of LC filters as components of communication devices has been under study. However, since conventional LC filters are relatively large, it has been difficult to use them for modules of small communication devices.

PTL 1 discloses a multilayer circuit board with a built-in coil. This circuit board is produced as follows to achieve a compact circuit configuration: a coil pattern, which constitutes part of a coil, is formed in at least two or more layers among wiring pattern layers; through holes are formed at predetermined portions of an electrical insulating substrate sandwiched between the respective coil patterns to extend between respective ends of the coil patterns; and the through holes are filled with a conductive paste so that the respective ends of the coil patterns are electrically connected to each other.

LC filters for high-density packaging may be produced using a Low Temperature Co-fired Ceramics (LTCC) technology.

Some techniques may be used to build a coil into a silicon substrate.

[Citation List] [Patent Literature] PTL 1: JP 2005-268447 A.

SUMMARY OF THE INVENTION

Technical Problem

Regarding the coil of PTL 1, however, since the above electrical insulating substrate is a glass epoxy substrate or the like, and the through holes are formed by machining using a drill or the like, ends of glass fibers are exposed at the inner peripheral wall of the through holes, resulting in the inner peripheral wall having a rough surface. In addition, a glass epoxy substrate inherently has a rough surface having asperities. Therefore, even when the coil pattern is formed as described above, the width and diameter of the wirings vary locally, which causes deterioration in electrical characteristics of the coil.

Further, in a substrate based on LTCC technology, a coil is formed having a thickness direction perpendicular to the substrate surface using multilayer ceramic wiring, and since it is inherently difficult to make it thin, it is difficult to accommodate it in the housing of a slim communication device. It is also difficult to provide such a substrate with a shield structure for protecting against noise produced by other electronic components, or provide such a substrate with a shield structure for preventing electromagnetic interference by forming wirings between the multilayer ceramic substrate and other electronic components.

Techniques for building a coil into a silicon substrate require the formation of an insulating film on silicon used as a circuit substrate because silicon is not a fully insulating material.

An object of the present invention is to provide circuit boards which are compact but have excellent electromagnetic shielding properties, for use in small-size, high-speed and high-capacity communication devices.

Solution to Problem

The present invention solves the problem described above, and the invention according to claim 1 is a circuit board comprising: a glass substrate having a first surface and a second surface facing away from the first surface; a first coil wiring pattern formed on the first surface and a second coil wiring pattern formed on the second surface, the first and second coil wiring patterns constituting part of at least one coil; a through hole extending through a predetermined portion of the glass substrate from an end of the first coil wiring pattern to an end of the second coil wiring pattern; a through hole inner conductive surface formed on the inner side of the through hole, the through hole inner conductive surface enabling electrical connection between the end of the first coil wiring pattern and the end of the second coil wiring pattern, the first and second coil wiring patterns and the through hole inner conductive surface constituting the at least one coil wound around a direction perpendicular to an axis of the through hole and to a direction in which the first and second coil wiring patterns extend; and an electromagnetic shielding layer comprised of conductive material, the electromagnetic shielding layer shielding against electromagnetic waves generated by the at least one coil.

The present invention of claim 2 is a circuit board according to claim 1, characterized in that the electromagnetic shielding layer is disposed directly above the at least one coil.

The present invention of claim 3 is a circuit board according to claim 1, characterized in that the electromagnetic shielding layer is disposed to entirely cover the at least one coil.

Advantageous Effects of the Invention

The present invention provides circuit boards which are compact but have excellent electromagnetic shielding properties, for use in small-size, high-speed and high-capacity communication devices.

BRIEF DESCRIPTION OF THE DRAWINGS

FIGS. 5(a), 5(b), 5(c), and 5(d) are diagrams (1) illustrating a process for producing the circuit board according to the embodiment.

FIGS. 10(q) and 10(r) are diagrams (6) illustrating a process for producing the circuit board according to the embodiment.

DETAILED DESCRIPTION

Embodiments of the present invention of will be described below with reference to the drawings. In the following description of the drawings to be referred, components or functions identical with or similar to each other are given the same or similar reference signs, unless there is a reason not to. It should be noted that the drawings are only schematically illustrated, and thus the relationship between thickness and two-dimensional size of the components, and the thickness ratio between the layers, are not to scale. Therefore, specific thicknesses and dimensions should be understood in view of the following description. As a matter of course, dimensional relationships or ratios may be different between the drawings.

Further, the embodiments described below are merely examples of configurations for embodying the technical idea of the present invention. The technical idea of the present invention does not limit the materials, shapes, structures, arrangements, and the like of the components to those described below. The technical idea of the present invention can be modified variously within the technical scope defined by the claims. The present invention is not limited to the following embodiments within the scope not departing from the spirit of the present invention.

In any group of successive numerical value ranges described in the present specification, the upper limit value or lower limit value of one numerical value range may be replaced with the upper limit value or lower limit value of another numerical value range. In the numerical value ranges described in the present specification, the upper limit values or lower limit values of the numerical value ranges may be replaced with values shown in examples. The configuration according to a certain embodiment may be applied to other embodiments.

With reference to the accompanying drawings, some embodiments of the present invention will be described.

Figure 1A:
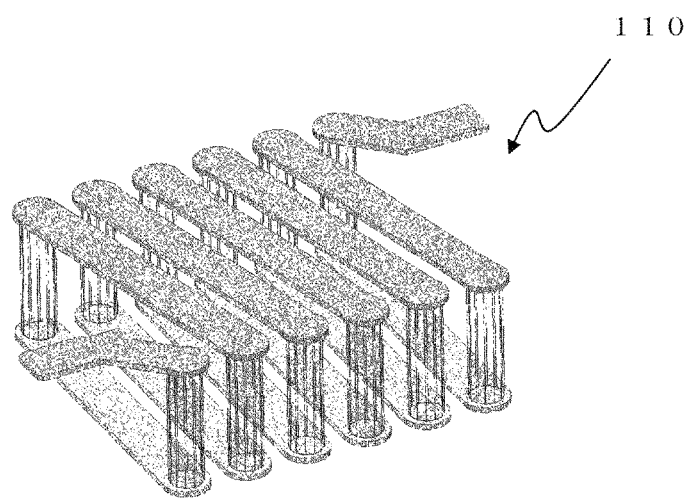
FIGS. 1(*a*) and 1(*b*) are schematic perspective views illustrating the structure of a coil (inductor) of a circuit board according to an embodiment, where FIG. 1(*a*) shows a glass substrate and through holes as transparent, while FIG. 1(*b*) shows coil wirings as transparent in addition to the glass substrate and through holes.
Figure 1B:
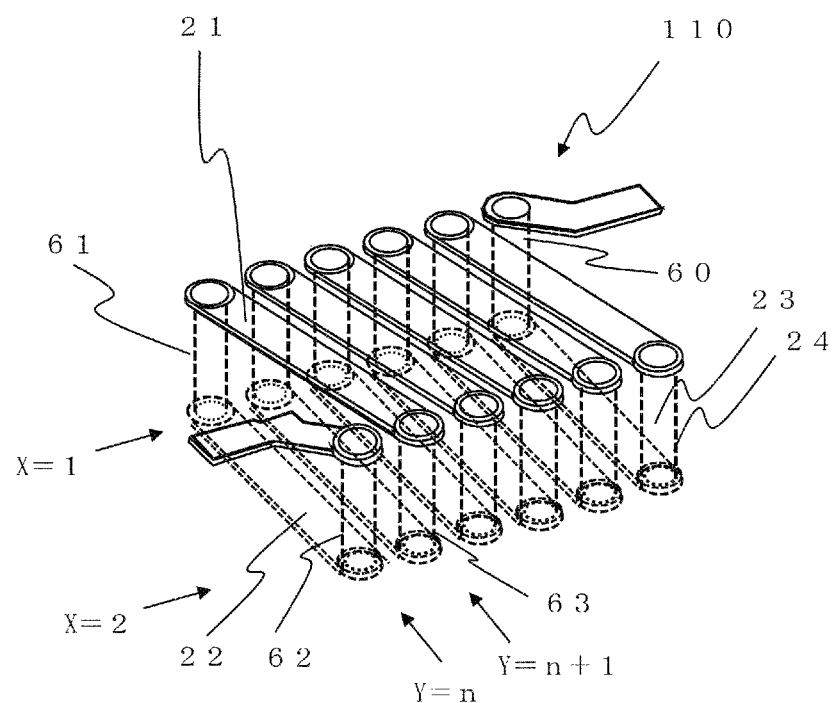

FIGS. 1(a) and 1(b) schematic perspective view illustrating the structure of a coil (inductor) of a circuit board according to the embodiment, where FIG. 1(a) shows a glass substrate and through holes as transparent. FIG. 1(b) shows coil wirings as transparent in addition to the glass substrate and through holes.

Figure 2:
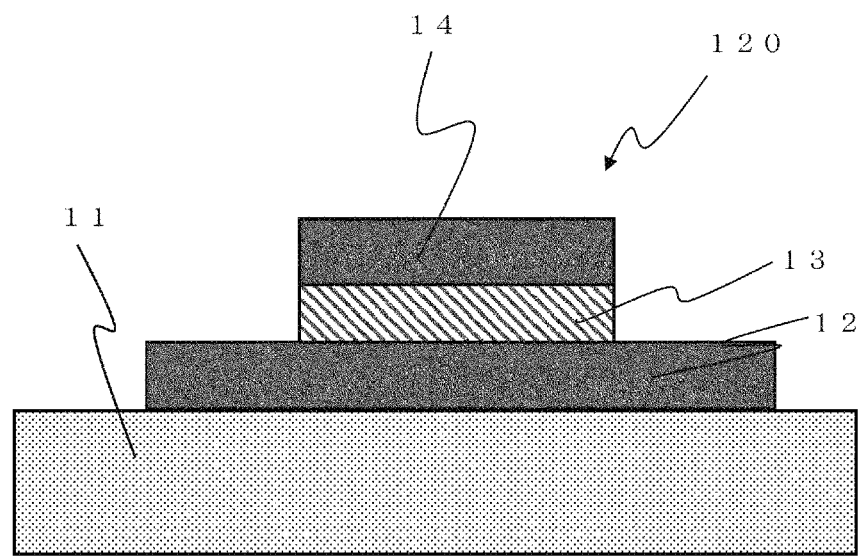
FIG. 2 is a schematic cross-sectional view illustrating the structure of a capacitor of a circuit board according to an embodiment.

FIG. 2 is a schematic cross-sectional view illustrating the structure of a capacitor of the circuit board according to the embodiment.

Figure 3:
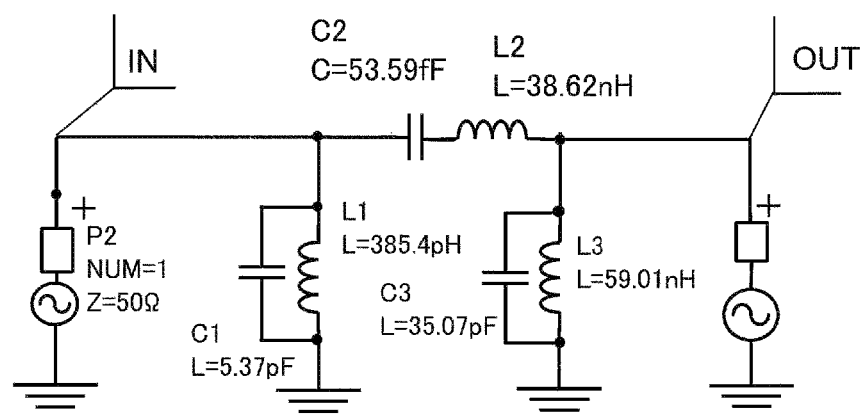
FIG. 3 is a circuit diagram illustrating an example of a circuit board according to an embodiment.
Figure 4:
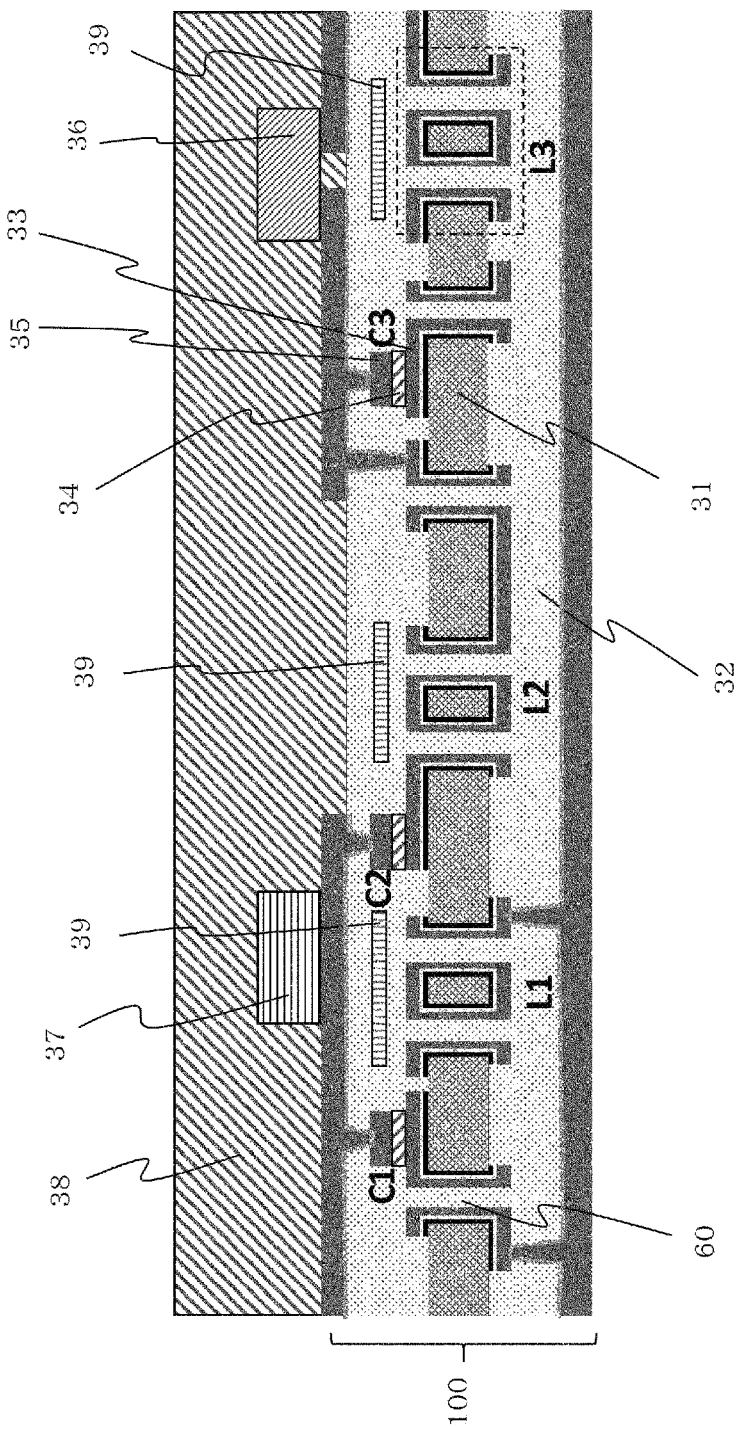
FIG. 4 is a schematic cross-sectional view of a circuit board according to an embodiment corresponding to the circuit diagram of FIG. 3.

FIG. 3 is a circuit diagram illustrating an example of the circuit board according to the embodiment. FIG. 4 is a schematic cross-sectional view of a circuit board according to an embodiment corresponding to the circuit diagram of FIG. 3.

A circuit board 100 according to the present embodiment includes a glass substrate 31 having a first surface and a second surface facing away from the first surface; a coil wiring pattern 21 formed on the first surface and a coil wiring pattern 22 formed on the second surface, the coil wiring patterns 21 and 22 constituting part of a coil 110; a through hole 23 extending through a predetermined portion of the glass substrate 31 from an end of the coil wiring pattern 21 to an end of the coil wiring pattern 22; a through hole inner conductive surface 24 formed on the inner side of the through hole 23, the through hole inner conductive surface 24 enabling electrical connection between the end of the coil wiring pattern 21 and the end of the coil wiring pattern 22, the coil wiring patterns 21 and 22 and the through hole inner conductive surface 24 constituting the coil 110 wound around a direction perpendicular to an axis of the through hole 23 and to a direction in which the coil wiring patterns 21 and 22 extend; and an electromagnetic shielding layer 39 comprised of conductive material, the electromagnetic shielding layer 39 disposed directly above the coil 110.

An example of the circuit board 100 according to the present embodiment will now be described in detail. Examples of a coil (inductor) and a capacitor formed as circuit elements of an LC circuit will now be described, where a coil (inductor), capacitance, and a substrate comprised of a glass substrate 31 as a core material having wiring layers and insulating resin layers alternately formed on both surfaces thereof are taken as an example.

<Coil (Inductor)>

The formation of the coil (i.e., inductor; represented by the letter L) will now be described. Helical coils can be built into a substrate having through holes 23. FIGS. 1(a) and(b) illustrate a glass substrate 31 as transparent. The glass substrate 31 has a parallel-plate shape and two rows of through holes. FIG. 1(b) illustrates wiring layers as transparent in addition to the glass substrate 31. In FIG. 1(b), coil wiring patterns 21 and 22 are respectively formed on the front and rear surfaces of a glass plate so that openings of adjacent through holes 23 are connected to each other; a conductor layer is formed on the inner wall of each through hole 23 extending from the front surface to the rear surface of the glass substrate 31, resulting in the inner surface of each through hole 23 being a through hole inner conductive surface 24; thus, through glass vias (TGV) 60 are formed.

The position of the TGVs 60 is defined as shown in FIG. 1(b). The position of any row of through holes 23 is defined by X, while the position of through holes 23 in any row thereof is defined as Y.

Here, a TGV (1, n) 61 is defined as a TGV located in the nth hole position in the first row (i.e., X=1, Y=n); and a TGV (2, n) 62 is defined as a TGV located in the nth hole position in the second row. The TGV (1, n) 61 and the TGV (2, n) 62 are connected to each other using the coil wiring pattern 22 on the rear surface, and the TGV (1, n) 61 and the TGV (2, n+1) 63 are connected to each other using the coil wiring pattern 21 on the front surface. Thus, the coil wiring pattern 22, the TGV (1, n) 61, the coil wiring pattern 21, and the TGV (2, n+1) 63 form an open circuit such that a conductor extends through the inside and the surface of the glass substrate 31 to produce one turn. When supplied with current, this circuit functions as an inductor. The characteristics of the inductor can be adjusted by changing the number of turns.

<Capacitor>

The capacitor (represented by the letter C) has a structure in which a dielectric is sandwiched between two conductive plates. As shown in FIG. 2, an example of the capacitor is produced as follows: a conductor layer (lower electrode of capacitor) 12 is laminated directly over a glass substrate (not shown) or on an insulating resin layer 11 formed on a glass substrate to form a conductor pattern; and the conductor pattern is further laminated with a dielectric layer 13 and a conductor layer (upper electrode of capacitor) 14 in this order. The conductor layer (lower electrode of capacitor) 12 and the conductor layer (upper electrode of capacitor) 14 may each have a multilayer structure comprised of a seed layer and a conductor layer.

<LC filter>

A band-pass filter (BPF) using an LC circuit will now be described as an example of a circuit board composed of a coil (inductor; abbreviated as L) and a capacitor (abbreviated as C). FIG. 3 is a basic circuit diagram of a BPF. The electrical capacitance (hereinafter, capacitance) of a capacitor and the induction coefficient (hereinafter, inductance) of an inductor in the circuit can be appropriately set to achieve a bandpass effect of passing frequencies in a desired range and blocking others.

FIG. 4 is a schematic diagram illustrating an LC circuit formed in the circuit board 100. The LC circuit is comprised of a coil (i.e., inductor; represented by the letter L) and a capacitor (represented by the letter C) as shown in the circuit diagram of FIG. 3. In FIGS. 4, L1, L2 and L3 each indicate a coil (inductor), while C1, C2 and C3 each indicate a capacitor.

Inductors L1, L2 and L3 can connect TGVs in the glass substrate 31 and coil wiring patterns on the front and rear surfaces of the glass substrate 31 to form a coil. The inductors L1, L2, and L3 are embedded in the glass substrate 31 and in the insulating resin layers 32 on the front and rear surfaces thereof, and, similarly to the capacitors C1, C2 and C3, conduction with electrodes of the outermost layers of the circuit board can be performed through the via holes in the insulating resin layer 32. The inductor L2 is a reactive element used in a circuit for suppressing interference between BPFs.

The capacitors C1, C2 and C3 are comprised of a conductor layer (lower electrode of capacitor) 33, a dielectric layer 34, and a conductor layer (upper electrode of capacitor) 35. The conductor layer 33, the dielectric layer 34, and the conductor layer 35 are disposed in this order on the upper surface of the glass substrate 31. The capacitors C1, C2 and C3 are embedded as a whole in the insulating resin layer 32 on the upper surface of the glass substrate 31. These capacitors may be electrically connected to an external electrode of the circuit board 100 via a conductor inside a via hole formed in the insulating resin layer 32.

<Process for Producing Circuit Board>

With reference to FIGS. 5 to 12, an example production process for a circuit board using a glass substrate 31 will now be described.

First, in order to design a circuit, a required capacitance and inductance depending on the frequency bands of the radio waves intended to be passed or blocked are calculated using simulation software. Tables 1 and 2 show the specifications of elements for achieving desired characteristics in the circuit configuration as shown in FIG. 3 for the band of 3400 MHz or higher and 3600 MHz or lower, for example. For the inductors L1 and L3, having very small inductance, it is not necessary to form a coil shape, and the self-inductance of a single wire is sufficient. For this reason, the dimensions of the wire are shown in the table.

TABLE 1

|  | C1 | C2 | C3 |
| --- | --- | --- | --- |
| Capacitance | 5.37 pF | 53.59 fF | 35.07 pF |
| Dielectric | SiN | SiN | SiN |
| Relative permittivity | 6.3 | 6.3 | 6.3 |
| Dielectric thickness | 200 nm | 200 nm | 200 nm |
| Side length | 138.7 μm | 13.9 μm | 354.5 μm |

TABLE 2

|  | L1 | L2 | L3 |
| --- | --- | --- | --- |
| Inductance | 385.4 pH | 38.62 nH | 59.01 pH |
| Number of turns |  | 11 |  |
| Coil width |  | 1.6 mm |  |
| Coil length |  | 1.5 mm |  |
| Coil thickness |  | 0.3 mm |  |
| Wire length | 1.33 mm |  | 0.2 mm |
| Wire width | 0.1 mm |  | 0.1 mm |
| Wire thickness | 15 μm |  | 15 μm |

The capacitance and inductance of the BPFs for 2499 MHz or higher and 2690 MHz or lower are also calculated using the same procedure as that described above to design a required circuit (values are omitted).

A required circuit board is fabricated on the basis of the circuit design described above. First, a low-expansion glass substrate 31 (thickness 300 μm, coefficient of thermal expansion: 3.5 ppm/K) is prepared as shown in FIG. 5(a). Then, through holes 43 having an opening diameter of 80 μm to 100 μm are formed in the glass substrate 31 as shown in FIG. 5(b). In the first step of formation of the through holes 43, desired positions of the glass substrate 31 are pulse-irradiated with a UV laser beam to form weakened portions in the glass. In the second step, the entire glass plate is etched using a hydrofluoric acid aqueous solution. Thus, the weakened portions are selectively etched, and highly accurate through holes 43 are quickly formed. In comparison with the case where a glass epoxy substrate is used, through holes 43 having a more accurate inner diameter and an inner peripheral surface with a reduced unevenness can be formed.

Next, as shown in FIG. 5(c), a titanium (Ti) film and a copper (Cu) film are sputter-deposited in this order on the entire surface of the glass substrate 31 as two layers to form a contact layer 44 under the wiring layer and on the inner wall of the through holes 43 of the glass substrate 31 so that the glass surface has electrical conductivity. The thickness of the Ti film is set to 50 nm, while the thickness of the Cu film is set to 300 nm.

Then, as shown in FIG. 5(d), in order to complement thin portions of the contact layer 44 (i.e., the sputter-deposited films) on the inner wall of the through holes 43, electroless nickel (Ni) plating is applied to form an electroless Ni plating layer 45, resulting in a laminate of the contact layer 44 (i.e., Ti/Cu films)/the Ni plating layer 45. This plating is applied to the entire front and rear surfaces of the glass substrate 31 and the inner wall of the through holes 43, with the plating thickness set to 0.2 μm. Thus, a seed layer is formed.

Although not shown, both surfaces of the glass substrate 31 are then laminated with, for example, a dry film resist manufactured by Hitachi Chemical Co., Ltd., product name RY-3525 (25 μm thickness) to thereby form a conductor pattern 46 of the inductor wirings, the lower electrode of the capacitor, the pads for external connection and the like by a semi-additive method using the laminate of the contact layer 44/the Ni plating layer 45 as the seed layer. The resist layer may be formed by applying a liquid resist. Then, the resist layer is exposed and developed via a mask for forming a conductor pattern, that is, a wiring pattern, by photolithography to form a wiring pattern (opening) in the resist layer.

Figure 6E:
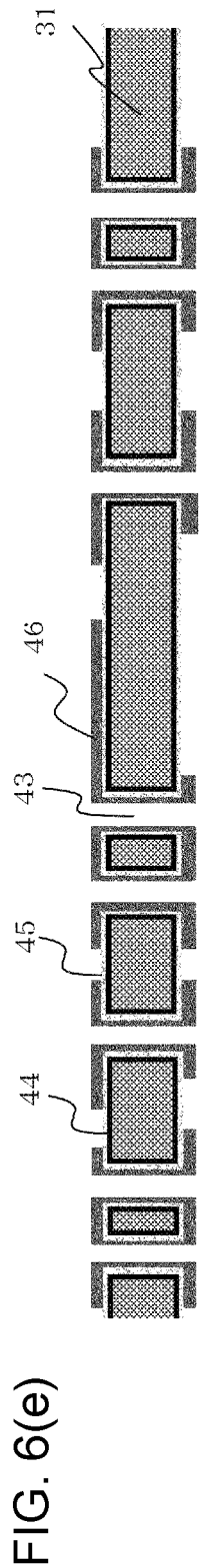
FIGS. 6(e), 6(f), and 6(g) are diagrams (2) illustrating a process for producing the circuit board according to the embodiment.

Next, copper is deposited in the opening by electrolytic copper plating to form the conductor pattern 46 as a conductive member with a thickness of 15 μm. In this step, copper plating is also deposited on the inner wall of the through holes 43 of the glass substrate 31. Subsequently, the dry film resist is removed. In this step, as shown in FIG. 6(e), parts of the front and rear surfaces of the glass substrate 31 are covered with a laminate of the contact layer 44 (i.e., Ti/Cu films)/the Ni plating layer 45, and parts of the laminate are copper-plated to form a conductor pattern 46. In the step shown in FIG. 6(e), a lower electrode of the capacitor is formed at a predetermined position on the conductor pattern 46. Alternatively, a lower electrode of the capacitor can also be formed using parts of the conductor pattern 46.

Figure 6F:
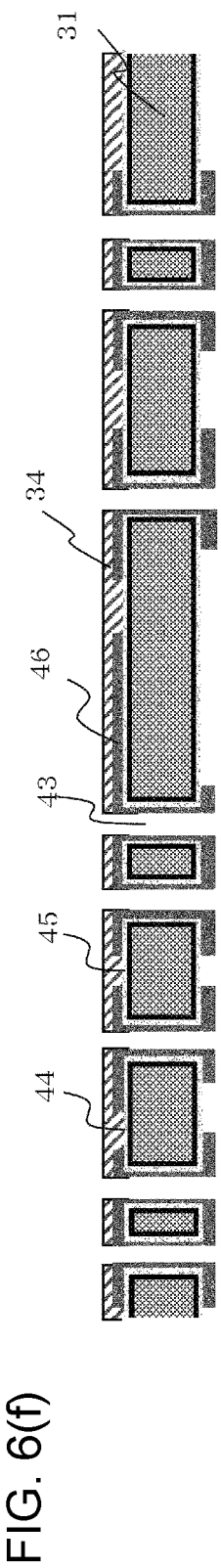
Figure 6G:
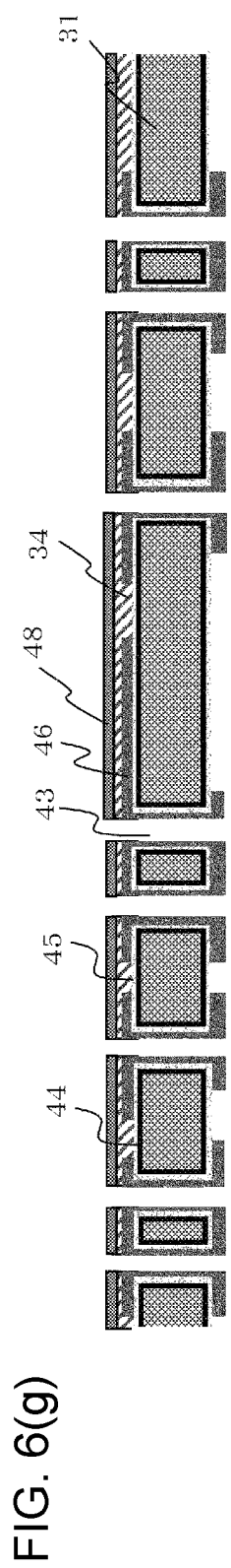

Then, as shown in FIG. 6(f), a silicon nitride (SiN) film having a thickness of 200 nm to 400 nm is formed as a dielectric layer 34 of the capacitor across a surface of the glass substrate 31 on which the capacitor is to be formed, using a chemical vapor deposition (CVD) method. Further, as shown in FIG. 6(g), a Ti film and a Cu film are formed in this order on the entire surface of the dielectric layer 34 by sputtering at a thickness of 50 nm and 300 nm, respectively, to form a seed layer 48 for formation of the upper electrode of the capacitor.

Figure 7H:
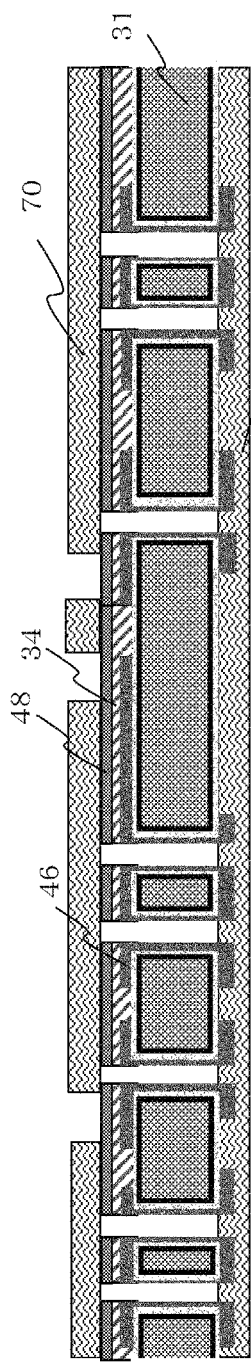
FIGS. 7(h), 7(i), and 7(j) are diagrams (3) illustrating a process for producing the circuit board according to the embodiment.
Figure 7I:
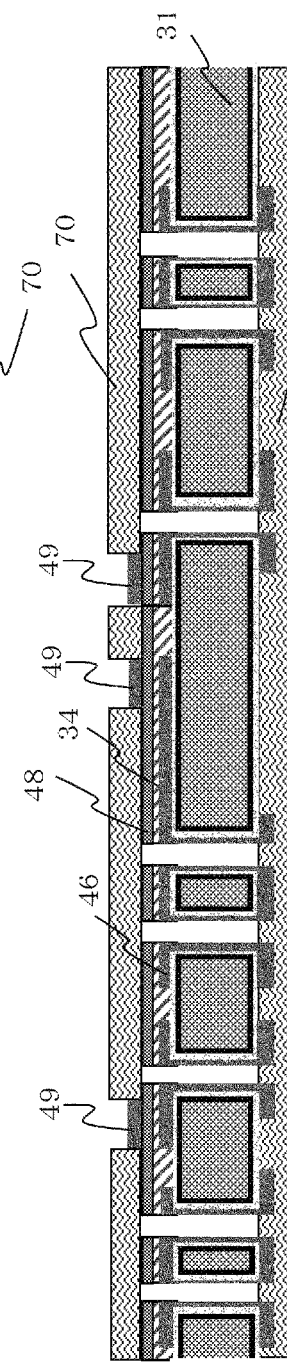
Figure 7J:
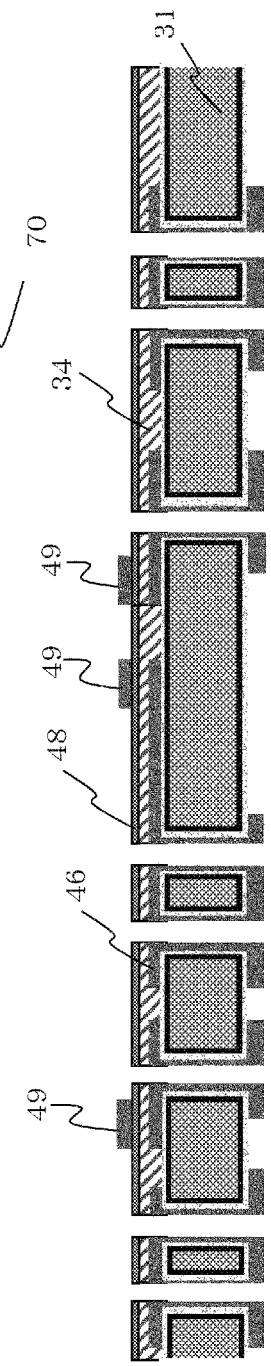

Subsequently, as shown in FIG. 7(h), only portions where the upper electrode of the capacitor is to be formed are exposed through the dry film resist layer 70 by photolithography. Then, as shown in FIG. 7(i), electrolytic copper plating is applied to form an upper electrode 49 having a thickness of 9 to 10 μm. After that, as shown in FIG. 7(j), the dry film resist layer 70 is removed. At this time, the dielectric layer 34, SiN layer, and the like are still laminated.

Figure 8K:
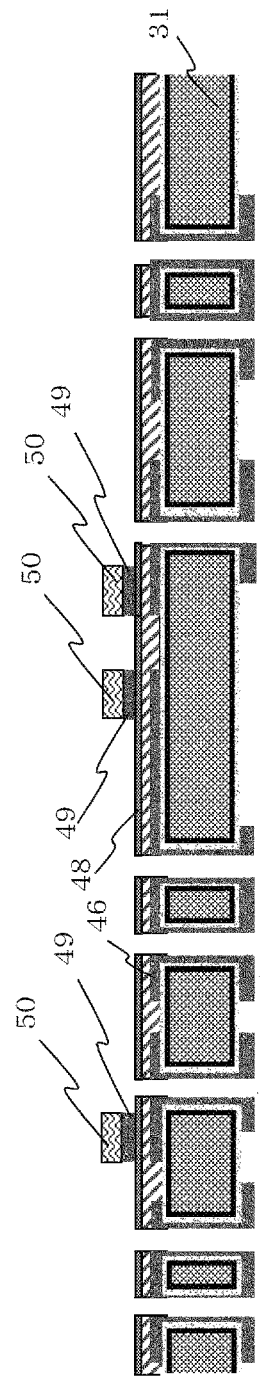
FIGS. 8(k) and 8(m) are diagrams (4) illustrating a process for producing the circuit board according to the embodiment.
Figure 8M:
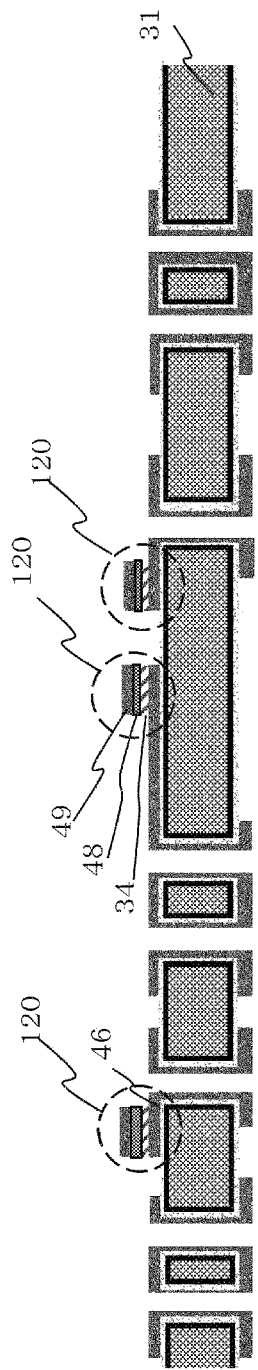

As shown in FIG. 8(k), only the upper electrode 49 of the capacitor is first protected by a dry film resist layer 50 by photolithography in order to remove excess portions of the contact layer, the plating seed layer, and the like.

Then, the substrate is processed by wet etching to remove excess portions of the sputtered copper layer produced during film formation of the upper electrode 49 of the capacitor, and the substrate is processed by dry etching to remove excess portions of the Ti layer and SiN layer.

More specifically, the uppermost sputtered Cu layer of the excess portions is removed with an etching solution. Then, the sputtered Ti layer and the SiN layer formed by CVD are removed by dry etching. Subsequently, the dry film resist layer 50 protecting the upper electrode 49 of the capacitor is peeled and removed. As shown in FIG. 9(m), the seed layer directly above the glass substrate 31 is still left.

Figure 9N:
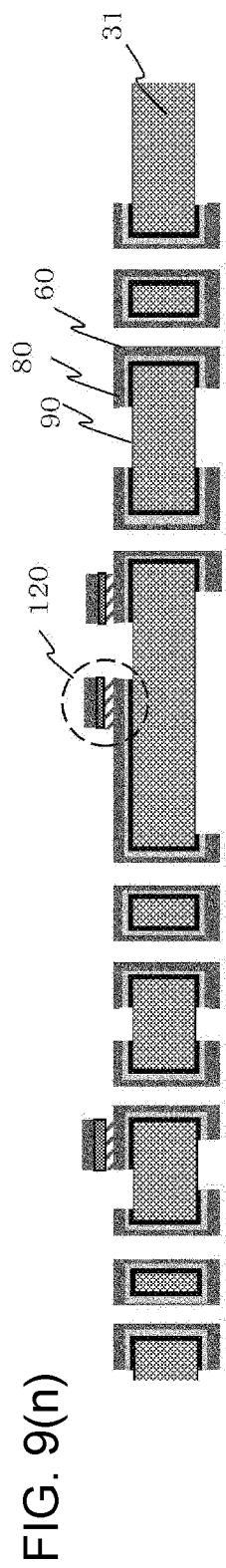
FIGS. 9(n), 9(o), and 9(p) are diagrams (5) illustrating a process for producing the circuit board according to the embodiment.

Then, as shown in FIG. 9(n), in order to remove the seed layer of the conductive layer for the lower electrode of the capacitor and the like formed on the surface of the glass substrate 31, the Ni plating layer is processed by wet etching. This processing also removes the sputtered Cu layer thereunder. The Cu layer forming the wiring, capacitor electrode, and the like has a relatively large thickness and is thus not completely removed although dissolved in the etching solution to some extent. Then, the sputtered Ti layer is removed by etching. At this point, the glass substrate 31 is exposed at portions where the wiring, electrode, and the like are not disposed. As a result, a capacitor 120 is formed on the surface of the glass substrate 31, and part of a continuous wiring 80 which is to form an inductor 110 (see FIG. 10(r)) is formed, thus connecting to a TGV 60. The contact layer and the seed layer in remaining regions of the glass substrate 31, referred to as glass substrate surface regions 90, are removed so that the glass substrate surface regions 90 are externally exposed.

Figure 9O:
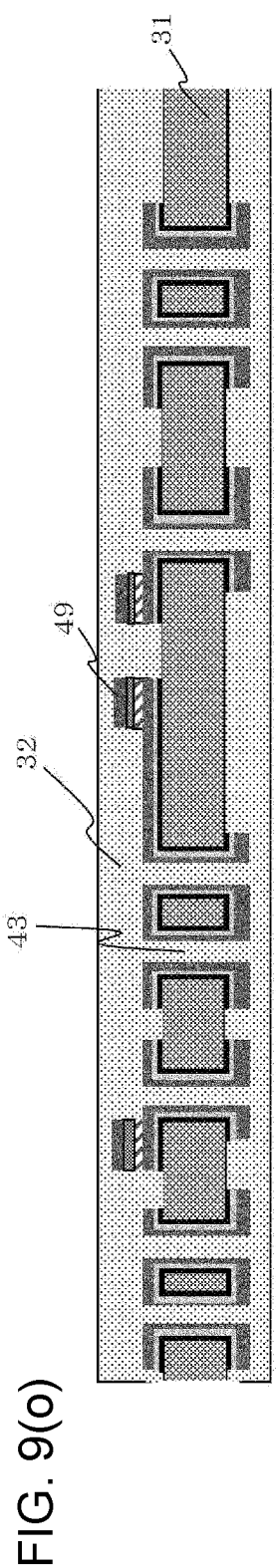

Next, as shown in FIG. 9(o), an insulating resin, for example, manufactured by Ajinomoto Fine-Techno Co., Inc. (product name "ABF GX-T31R") is attached to both surfaces of the glass substrate 31 to form an insulating resin layer (resin build layer) 32. This processing is performed using a vacuum laminating press machine, and the through holes 43 of the glass substrate 31 are sealed with an insulating resin without voids. The thickness of the insulating resin layer 32 is set to approximately 35 μm so that the upper electrode 49 of the capacitor is completely embedded therein.

Figure 9P:
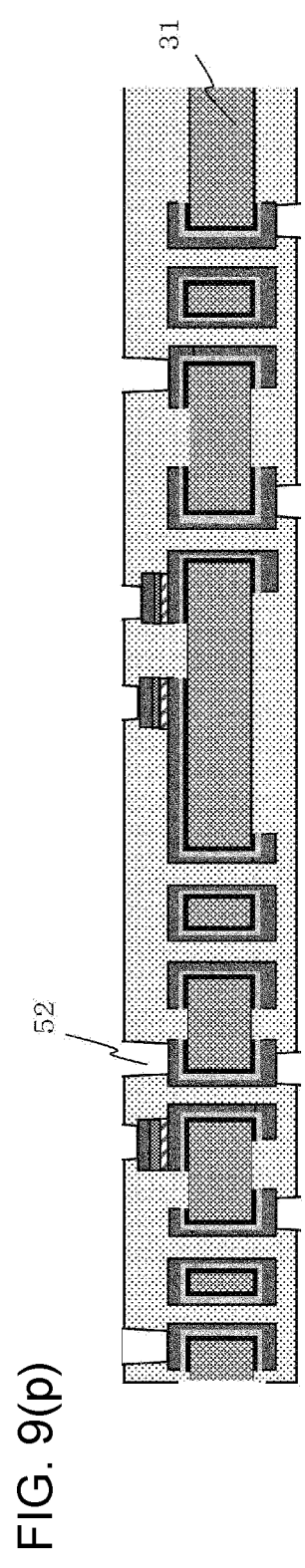

Further, the insulating resin layer 32 is processed by laser at a position where electric conduction is desired to thereby form a hole 52 that reaches the wiring layer of the glass substrate 31 as shown in FIG. 9(p). The hole 52 preferably has a diameter of approximately 60 μm.

Although not shown, the insulating resin layer 32 on the front and rear surfaces of the glass substrate 31 is processed with an alkaline surface roughening solution to thereby adjust the arithmetic surface roughness Ra to 60 nm. The purpose of this processing is to increase the adhesion of the seed layer in the next step.

Next, as shown in FIG. 10(q), electroless Cu plating is applied to the insulating resin layer 32 on the front and rear surfaces of the glass substrate 31 to form a conductive seed layer 53. The conductive seed layer 53 preferably has a thickness of 0.6 μm. With this processing, the conductive seed layer 53 is formed not only on the front and rear surfaces of the glass substrate 31 but also on the inner wall of the hole that has been previously formed by laser processing.

Then, as shown in FIG. 10(r), a dry film resist layer is attached to both surfaces of the substrate, and an opening is formed by photolithography at positions where wirings 54 are to be provided. Then, electrolytic plating is applied to the substrate to form wirings having a thickness of 15 μm. Further, in the electrolytic plating, the hole 52 in the insulating resin layer 32 is filled with copper, and is electrically connected to the conductor layer on the surface of the glass substrate 31.

Then, unnecessary portions of the conductive seed layer are removed by etching. Thus, a basic circuit board 100 provided with the built-in elements for the LC circuit is completed. In the figure, the built-up wiring on the underside of the glass substrate 31 is shown as if it has a copper layer, which serves as a ground for the capacitor and inductor incorporated in the circuit board 100. However, this is not necessarily required for an actual circuit board as long as predetermined capacitors and inductors are grounded when the circuit board is completed.

Figure 11S:
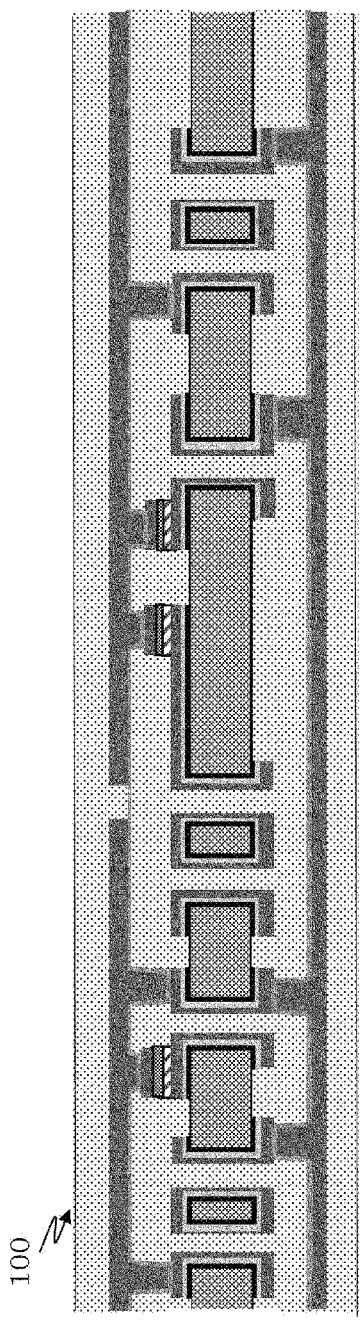
FIGS. 11(s) and 11(t) are diagrams (7) illustrating a process for producing the circuit board according to the embodiment.
Figure 11T:
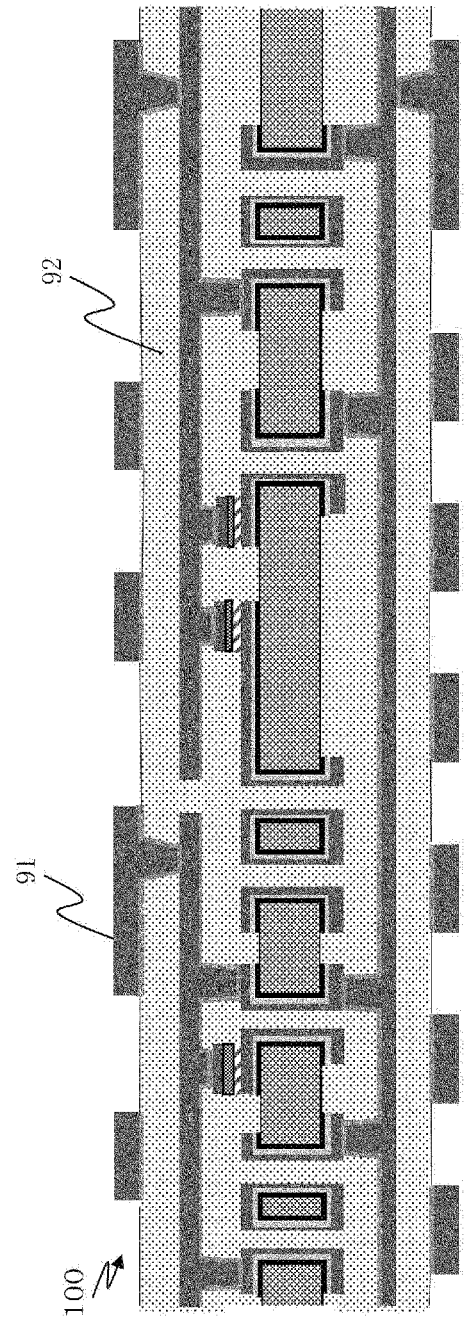

Then, if necessary, the steps of FIG. 9(o) to FIG. 10(r) are repeated to laminate the insulating resin layer 92 and conductor wiring layer 91 as shown in FIGS. 11(s) and 11(t), and electronic components are mounted thereon.

Figure 12:
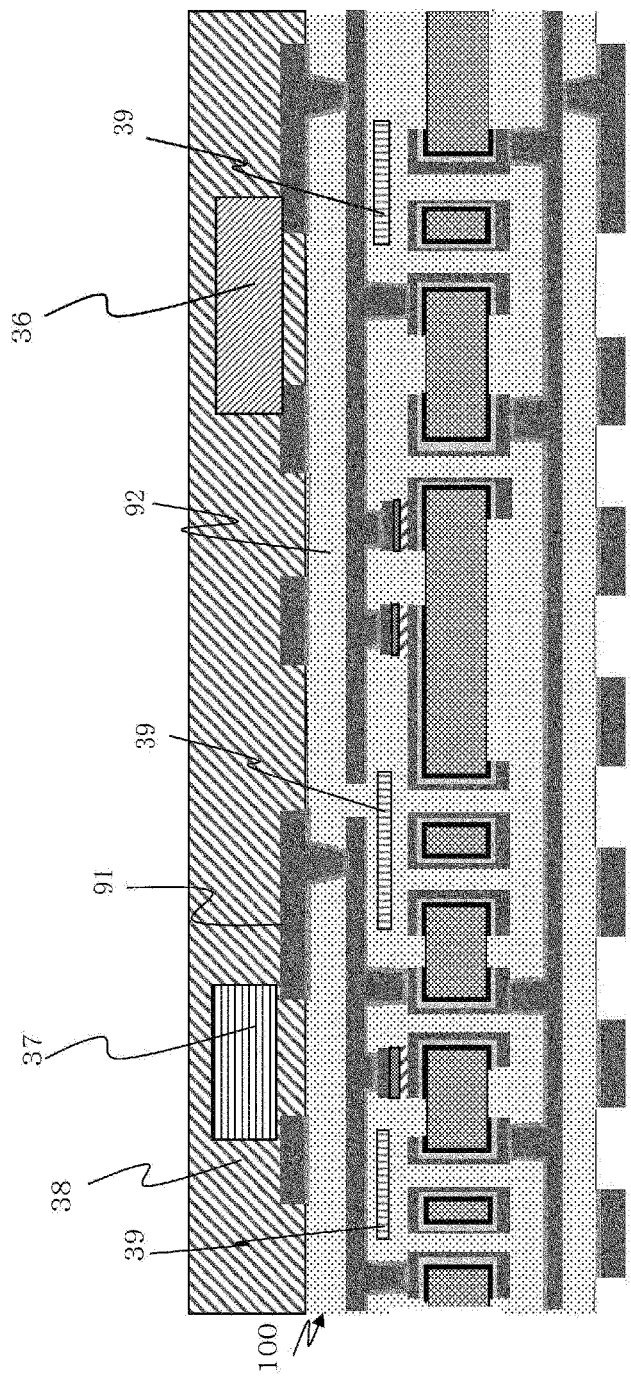
FIG. 12 is a diagram showing a circuit board according to an embodiment.

As shown in FIG. 12, an electromagnetic shielding layer 39, which is a single-layer electromagnetic shielding layer made of copper, may be disposed directly above the coil (inductor) 110 to suppress mutual interference from passive components. The electromagnetic shielding layer may be formed by sputtering or plating. Disposing the electromagnetic shielding layer on both surfaces of the glass substrate reduces the influence of electromagnetic waves from a motherboard and mounted components.

Flat (e.g., a spiral shape) coils may be formed on the surface of the glass substrate 31 or the insulating resin layer 32.

Further, when the conductor pattern 46 made of copper is laminated on the glass substrate 31, a silicon nitride layer or the like can be provided, for example, directly on the glass substrate 31 in order to prevent occurrence of warpage or cracking of the glass substrate 31 due to stress imbalance. The silicon nitride layer has a function of relieving the residual stress in the conductor pattern 46 of copper. Thus, a built-up wiring layer in which the stress is adjusted can be provided by this combination. However, it should be noted that the silicon nitride layer is merely an example, and is not limited thereto.

Conductive components on one surface of the glass substrate 31 may be connected to passive components mounted on the circuit board, while conductive components on the other surface of the glass substrate 31 may be connected to a motherboard (not shown).

In the present embodiment, circuit elements are built into a circuit board. This configuration allows other components to be mounted on regions of the circuit board surface located above the circuit elements, thereby providing a compact and high-performance circuit board. When mounted with switching components, the circuit board according to the present embodiment was observed to operate with stability and less noise.

[Reference Signs List] 11 . . . Insulating resin layer; 12 . . . Conductor layer (lower electrode of capacitor); 13 . . . Dielectric layer; 14 . . . Conductor layer (upper electrode of capacitor); 21, 22 . . . Coil wiring pattern; 23 . . . Through hole; 24 . . . Through hole inner conductive surface; 31 . . . Glass substrate; 32 . . . Insulating resin layer; 33 . . . Conductor layer (lower electrode of capacitor); 34 . . . Dielectric layer; 35 . . . Conductor layer (upper electrode of capacitor); 36 . . . Passive component; 37 . . . Active component; 38 . . . Mold resin; 39 . . . . Electromagnetic shielding layer; 43 . . . Through hole; 44 . . . Contact layer (sputtered layer of titanium (Ti)/sputtered layer of copper (Cu)); 45 . . . Layer of nickel (Ni) plating; 46 . . . Conductor pattern (copper wiring directly above glass: including lower electrode of capacitor); 48 . . . Seed layer (sputtered layer of titanium (Ti)/sputtered layer of copper (Cu); above dielectric layer); 49 . . . . Upper electrode of capacitor; 50 . . . Dry film resist layer (for capacitor protection); 52 . . . Hole in insulating resin layer; 53 . . . Conductive seed layer; 54 . . . Wiring; 60 . . . Through glass via (TGV); 61 . . . TGV (1, n); 62 . . . TGV (2, n); 63 . . . TGV (2, n+1); 70 . . . Dry film resist layer; 80 . . . . Wiring; 90 . . . Glass substrate surface region; 91 . . . Conductor wiring layer; 92 . . . Insulating resin layer; 100 . . . Circuit board; 110 . . . Coil (inductor); 120 . . . Capacitor; C1, C2, C3 . . . . Capacitor; X . . . Row position; Y . . . Hole position in row; n . . . Position of any hole in row.

What is claimed is:

1. A circuit board, comprising:
a glass substrate having a first surface and a second surface facing away from the first surface, a space between the first surface and the second surface of the glass substrate consists of (a) glass, (b) a plurality of distinct through holes and (c) a conductor layer on an inner wall of each through hole of the plurality of distinct through holes;
a first coil wiring pattern formed on the first surface and a second coil wiring pattern formed on the second surface, the first and second coil wiring patterns each constituting part of at least one coil; wherein
each through hole of the plurality of distinct through holes extends through a predetermined portion of the glass substrate from an end of the first coil wiring pattern to an end of the second coil wiring pattern;
conductive layer provides electrical connection between the end of the first coil wiring pattern and the end of the second coil wiring pattern,
the first and second coil wiring patterns and the conductive layer of at least one through hole of the plurality of distinct through holes constitutes the at least one coil wound around a direction perpendicular to an axis of the through hole and to a direction in which the first and second coil wiring patterns extend; and
an electromagnetic shielding layer comprising a conductive material, the electromagnetic shielding layer shielding against electromagnetic waves generated by the at least one coil.

2. The circuit board of claim 1, wherein the electromagnetic shielding layer is disposed directly above the at least one coil.

3. The circuit board of claim 1, wherein the electromagnetic shielding layer is disposed to entirely cover the at least one coil.

4. The circuit board of claim 1, wherein the electromagnetic shielding layer comprises an insulating resin layer and a conductive layer, an area of the conductive layer being greater than or equal to that of at least one of the first and second coil wiring patterns.

5. The circuit board of claim 4, wherein the electromagnetic shielding layer comprises a plurality of electromagnetic shielding layers each including at least one layer that is the insulating resin layer, the electromagnetic shielding layers being arranged such that one of the electromagnetic shielding layers of said plurality of electromagnetic shielding layers constitutes an outermost layer of the circuit board.

6. The circuit board of claim 4, wherein the conductive layer of the electromagnetic shielding layer comprises a non-magnetic metal.

* * * * *